(12) United States Patent
Chen

(10) Patent No.: US 6,420,788 B1
(45) Date of Patent: Jul. 16, 2002

(54) METHOD FOR MOUNTING A SEMICONDUCTOR CHIP ON A SUBSTRATE AND SEMICONDUCTOR DEVICE ADAPTED FOR MOUNTING ON A SUBSTRATE

(76) Inventor: I-Ming Chen, No. 60, Lane 328, Li-Shan St., Nei-Hu Dist., Taipei City (TW)

( * ) Notice: Subject to any disclaimer, the term of this patent is extended or adjusted under 35 U.S.C. 154(b) by 0 days.

(21) Appl. No.: 09/688,855

(22) Filed: Oct. 16, 2000

(30) Foreign Application Priority Data

Aug. 25, 2000 (TW) .......................... 089117240

(51) Int. Cl.⁷ .................. H01L 23/48; H01L 23/52; H01L 29/46
(52) U.S. Cl. ........................ 257/777; 257/787
(58) Field of Search ........................... 257/666, 690, 257/700, 737, 738, 774, 777, 778, 781, 787

(56) References Cited

U.S. PATENT DOCUMENTS 5,535,101 A * 7/1996 Miles et al. ............... 367/808
5,990,546 A * 11/1999 Igarashi et al. ............ 257/700
6,143,991 A * 11/2000 Moriyama .................. 174/261
6,187,615 B1 * 2/2001 Kim et al. .................. 438/113
6,200,143 B1 * 3/2001 Haba et al. ................. 439/70

* cited by examiner

Primary Examiner—David Nelms
Assistant Examiner—David Nhu
(74) Attorney, Agent, or Firm—Christensen O'Connor Johnson Kindness PLLC

(57) ABSTRACT

A method for manufacturing a semiconductor device includes the steps of providing a semiconductor chip having a pad-mounting surface with a bonding pad, forming an insulative isolating layer on the pad-mounting surface, and forming a conductive body in the insulative isolating layer. The isolating layer has a contact receiving cavity, and an access hole for access to the contact receiving cavity. The access hole is narrower than the contact receiving cavity. The conductive body has an anchor portion filling the contact receiving cavity and the access hole and connecting electrically with the bonding pad.

9 Claims, 3 Drawing Sheets

METHOD FOR MOUNTING A SEMICONDUCTOR CHIP ON A SUBSTRATE AND SEMICONDUCTOR DEVICE ADAPTED FOR MOUNTING ON A SUBSTRATE

BACKGROUND OF THE INVENTION

1. Field of the Invention

This invention relates to a method for mounting a semiconductor chip on a substrate and to a semiconductor device that is adapted for mounting on a substrate.

2. Description of the Related Art

With the rapid advancement in semiconductor fabrication technology, the bonding pads on the surface of a semiconductor chip are getting smaller in size, and the distance between adjacent bonding pads are getting shorter. These can create difficulty when connecting the semiconductor chip to an external circuit, and can affect adversely the production yield.

SUMMARY OF THE INVENTION

According to one aspect of the present invention, a semiconductor device is adapted for mounting on a substrate having a chip-mounting region provided with a plurality of solder points. The semiconductor device comprises: a semiconductor chip having a pad-mounting surface provided with a plurality of bonding pads which are disposed on the pad-mounting surface at locations that are offset from locations of corresponding ones of the solder points on the chip-mounting region; a photoresist layer formed on the pad-mounting surface of the semiconductor chip, the photoresist layer being formed with a plurality of contact-receiving cavities adjacent to and registered with the bonding pads on the pad-mounting surface, and a plurality of access holes for access to the contact-receiving cavities, the access holes being narrower than the contact-receiving cavities, each access hole being confined by a first wall that flares outwardly from a corresponding contact-receiving cavity to define a neck and the corresponding contact-receiving cavity being confined by a second wall that cooperates with the first wall to define a shoulder connected to the neck; and a plurality of conductive bodies, each of which has an extension portion, an anchor portion, and a contact portion on opposite ends of the extension portion, the anchor portion connecting electrically with a respective one of the bonding pads by filling a respective one of the contact-receiving cavities to conform to the shoulder and a respective one of the access holes to conform to the neck to form a secure means that inhibits the peeling of the anchor portion from the respective one of the bonding pad, the contact portion being formed on a surface of the photoresist layer opposite to the pad-mounting surface and being disposed at a location corresponding to that of a respective one of the solder points on the chip-mounting region of the substrate, the extension portion being formed on the surface of the photoresist layer and interconnecting the anchor and contact portions.

According to a further aspect of the present invention, a semiconductor device comprises: a semiconductor chip having a pad-mounting surface provided with a bonding pad; an insulative isolating layer formed on the pad-mounting surface, the isolating layer being formed with a contact-receiving cavity that is adjacent to and registered with the bonding pad, and an access hole for access to the contact-receiving cavity, the access hole being narrower than the contact-receiving cavity, the access hole being confined by a first wall that flares outwardly from the contact-receiving cavity to define a neck and the contact-receiving cavity being confined by a second wall that cooperates with the first wall to define a shoulder connected to the neck; and a conductive body connecting electrically with the bonding pad and having an anchor portion that fills the contact-receiving cavity to define a first member and the access hole to define a second member continuously joined with the first member such that the first member abuts against the shoulder and creates a force opposite from a peeling force to thereby secure the anchor portion against the bonding pad.

BRIEF DESCRIPTION OF THE DRAWINGS

In drawings which illustrate an embodiment of the invention.

DETAILED DESCRIPTION OF THE PREFERRED EMBODIMENT

Figure 1:
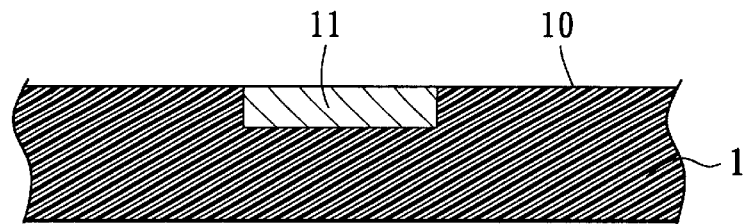
FIG. 1 is a schematic view illustrating a semiconductor chip to be mounted on a substrate according to a method of this invention.
Figure 7:
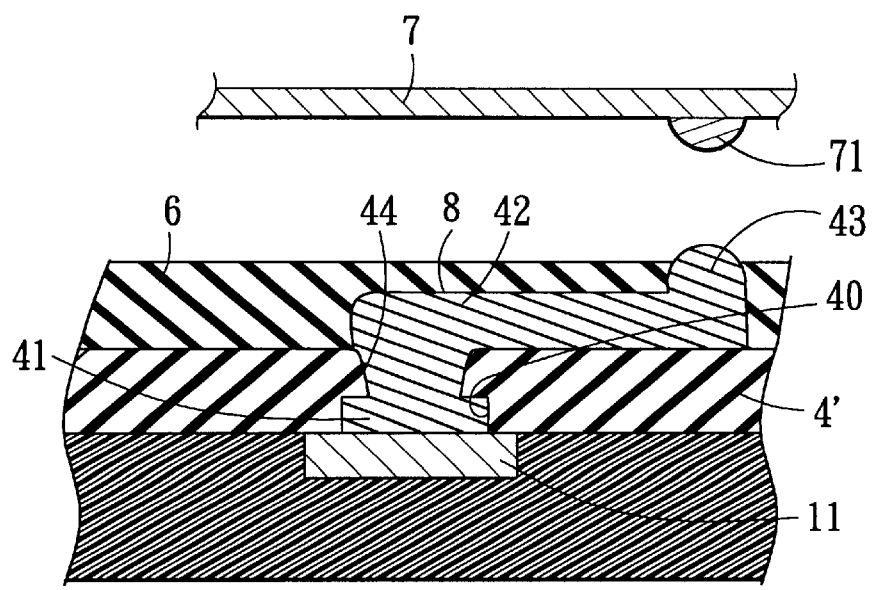
FIG. 7 is a schematic view to illustrate formation of a conductive body in the contact receiving cavity and an insulative protecting layer on the cured photoresist layer of FIG. 6.

FIG. 1 illustrates a semiconductor chip 1 to be mounted on a substrate 7 (see FIG. 7) according to the method of this invention. The substrate 7 has a chip-mounting region provided with a plurality of solder points 71 (only one solder point 71 is shown in FIG. 7). The semiconductor chip 1 has a pad-mounting surface 10 provided with a plurality of bonding pads 11 (only one bonding pad 11 is shown in FIG. 1), which are to be connected to corresponding ones of the solder points 71 and which are disposed on the pad-mounting surface 10 at locations that are offset from locations of the corresponding ones of the solder points 71 on the chip-mounting region of the substrate 7 (see FIG. 7).

FIGS. 2 to 7 illustrate consecutive steps of processing the semiconductor chip 1 for forming a semiconductor device that is to be mounted on the substrate 7 according to the method of this invention.

Figure 2:
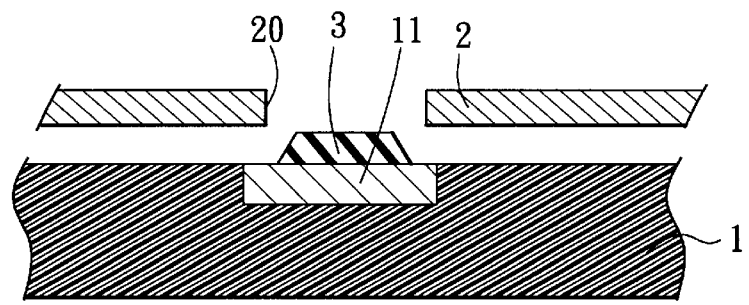
FIG. 2 is a schematic view illustrating a printing screen plate used in the method of this invention for forming a pad-protecting body on a bonding pad on a pad-mounting surface of the semiconductor chip of FIG. 1.

In FIG. 2, a steel plate 2 is used, and is superimposed on the pad-mounting surface 10 of the semiconductor chip 1. The steel plate 2 is a printing screen plate 2 in the embodiment of this invention, and is formed with a plurality of non-intersecting holes 20 (only one hole 20 is shown in FIG. 2) at positions registered with the bonding pads 11 of the semiconductor chip 1. A plurality of pad-protecting bodies 3 are formed on the pad-mounting surface 10 via a printing technique that uses an insulator material, such as gel-like resin or rosin, as printing material. Each pad-protecting body 3 covers at least a portion of a respective one of the bonding pads 11. The pad-protecting bodies 3 can be also formed via photolithography and etching process that includes steps of forming a photoresist layer on the pad-mounting surface 10, exposing the photoresist layer at positions registered with the bonding pads 11, and removing unexposed regions of the photoresist layer by solvent washing. Each pad-protecting body 3 has a cross-section that is gradually reduced in a direction away from the pad-mounting surface 10.

Figure 3:
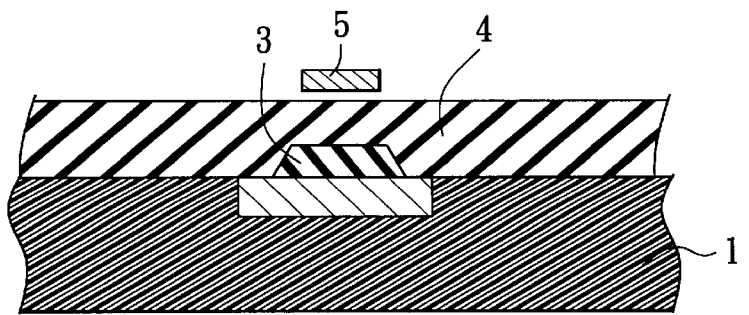
FIG. 3 is a schematic view illustrating a photoresist layer formed on the pad-mounting surface of the semiconductor chip of FIG. 1, and a mask used in the method of this invention.

In FIG. 3, a light-curable layer, such as a photoresist layer 4, is formed on the pad-mounting surface 10 such that the pad-protecting bodies 3 are embedded in the photoresist layer 4, and a mask 5 is superimposed on the phtoresist layer 4.

Figure 4:
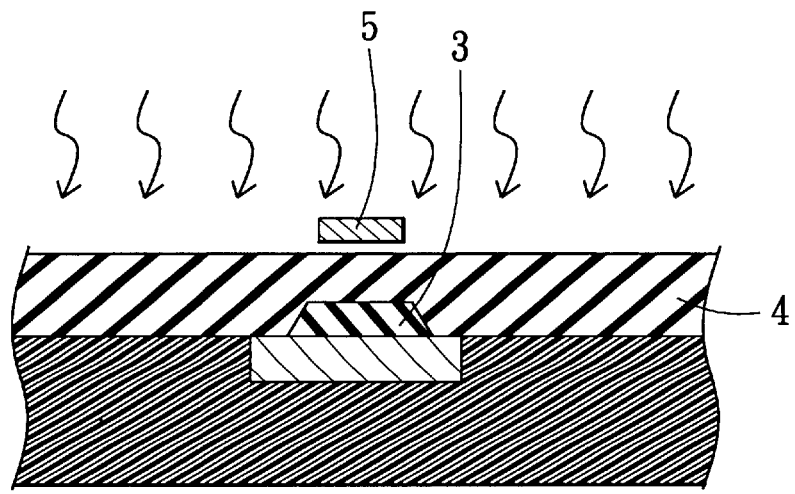
FIG. 4 is a schematic view to illustrate the photoresist layer of FIG. 3 undergoing a photolithography process according to the method of this invention.

In FIG. 4, the photoresist layer 4 is exposed at positions that are offset from the pad-protecting bodies 3. The exposed portion of the photoresist layer 4 hardens, and forms an insulative isolating layer 4' that covers the pad-mounting surface 10.

Figure 5:
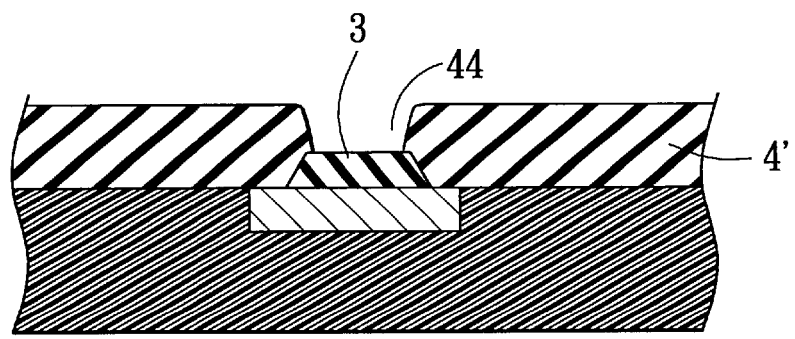
FIG. 5 is a schematic view illustrating an access hole formed in the cured photoresist layer of FIG. 4 according to the method of this invention.

In FIG. 5, a plurality of access holes 44 (only one is shown) are formed in the photoresist layer 4 by removing the unexposed portion of the photoresist layer 4' from the isolating layer 4' via solvent washing. Each of the access holes 44 exposes a portion of a respective one of the pad-protecting bodies 3.

Figure 6:
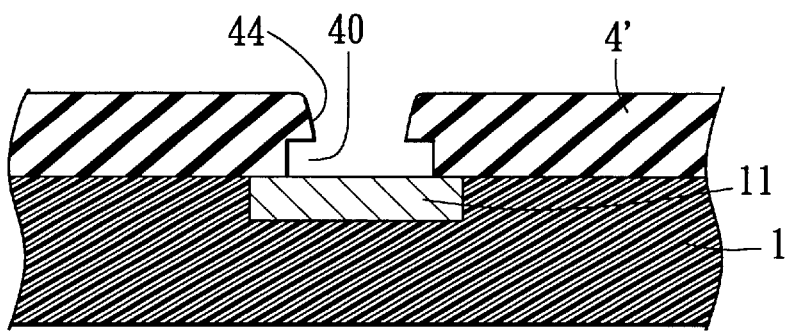
FIG. 6 is a schematic view to illustrate removal of the pad-protecting body to form a contact receiving cavity via a solvent washing process according to the method of this invention.

In FIG. 6, the pad-protecting bodies 3 are removed from the pad-mounting surface 3 by solvent washing via the access holes 44, thereby forming a plurality of contact receiving cavities 40 (only one is shown) in the isolating layer 4' at positions registered with the bonding pads 11 on the pad-mounting surface 10. Each contact receiving cavity 40 extends from a respective access hole 44, and has a width greater than that of the respective access hole 44. Preferably, the contact receiving cavity 40 and the respective access hole 44 form an inverted T-shaped cross-section.

In FIG. 7, a plurality of conductive bodies 8 (only one is shown) are formed respectively in the contact receiving cavities 40 and the access holes 44. Each of the conductive bodies 8 has an extension portion 42, and an anchor portion 41 and a contact portion 43 on opposite ends of the extension portion 42. The anchor portion 41 fills a respective one of the contact receiving cavities 40 and a respective one of the access holes 44, connects electrically with a respective one of the bonding pads 11, and has a cross-section conforming to the inverted T-shaped cross-section of the respective one of the contact receiving cavities 40 and the respective one of the access holes 44. The contact portion 43 is formed on a surface of the isolating layer 4 opposite to the pad-mounting surface 10, and is disposed at the location corresponding to a respective one of the solder points 71 on the chip-mounting region of the substrate 7. The extension portion 42 is formed on the surface of the isolating layer 4', and interconnects the anchor and contact portions 41, 43. The conductive bodies 8 are formed from conductive paste. An insulative protecting layer 6 can be formed on the isolating layer 4' to cover the anchor and extension portions 41, 42 of the conductive bodies 8.

With the design of the conductive bodies 8 according to the method of this invention, the difficulty encountered in the prior art can be abated, and the production yield can be significantly increased. Moreover, with the anchor portion 41 embedded in the isolating layer 4' and with the extension portion 42 embedded in the protecting layer 6, the anchor portion 41 of the conductive body 8 can be held firmly in contact with the bonding pad 11 without peeling off during the subsequent processing steps, such as thermal test.

With the invention thus explained, it is apparent that various modifications and variations can be made without departing from the spirit of the present invention. It is therefore intended that the invention be limited only as recited in the appended claims.

I claim:

1. A semiconductor device adapted for mounting on a substrate, the substrate having a chip-mounting region provided with a plurality of solder points, said semiconductor device comprising:

a semiconductor chip having a pad-mounting surface provided with a plurality of bonding pads which are disposed on said pad-mounting surface at locations that are offset from locations of corresponding ones of the solder points on the chip-mounting region;

a photoresist layer formed on said pad-mounting surface of said semiconductor chip, said photoresist layer being formed with a plurality of contact-receiving cavities adjacent to and registered with said bonding pads on said pad-mounting surface, and a plurality of access holes for access to said contact-receiving cavities, said access holes being narrower than said contact-receiving cavities, each access hole being confined by a first wall that flares outwardly from a corresponding contact-receiving cavity to define a neck and said corresponding contact-receiving cavity being confined by a second wall that cooperates with said first wall to define a shoulder connected to said neck; and a plurality of conductive bodies, each of which has an extension portion, an anchor portion, and a contact portion on opposite ends of said extension portion, said anchor portion connecting electrically with a respective one of said bonding pads by filling a respective one of said contact-receiving cavities to conform to said shoulder and a respective one of said access holes to conform to said neck to form a secure means that inhibits the peeling of said anchor portion from the respective one of said bonding pads, said contact portion being formed on a surface of said photoresist layer opposite to said pad-mounting surface and being disposed at a location corresponding to that of a respective one of the solder points on the chip-mounting region of the substrate, said extension portion being formed on said surface of said photoresist layer and interconnecting said anchor and contact portions.

2. The semiconductor device of claim 1, wherein said conductive bodies are formed from conductive paste.

3. The semiconductor device of claim 1, further comprising an insulative protecting layer formed on said photoresist layer to cover said anchor and extension portions of said conductive bodies.

4. A semiconductor device comprising:

a semiconductor chip having a pad-mounting surface provided with a bonding pad;

an insulative isolating layer formed on said pad-mounting surface, said isolating layer being formed with a contact-receiving cavity that is adjacent to and registered with said bonding pad, and an access hole for access to said contact-receiving cavity, said access hole being narrower than said contact-receiving cavity, said access hole being confined by a first wall that flares outwardly from said contact-receiving cavity to define a neck and said contact-receiving cavity being confined by a second wall that cooperates with said first wall to define a shoulder connected to said neck; and a conductive body connecting electrically with said bonding pad and having an anchor portion that fills said contact-receiving cavity to define a first member and said access hole to define a second member continuously joined with said first member such that said first member abuts against said shoulder and creates a force opposite from a peeling force to thereby secure said anchor portion against said bonding pad.

5. The semiconductor device of claim 4, wherein said conductive body is formed from conductive paste.

6. The semiconductor device of claim 4, wherein said isolating layer is made from a photoresist material.

7. The semiconductor device of claim 4, wherein said conductive body further has an extension portion formed on a surface of said isolating layer opposite to said pad-mounting surface and connected at one end to said anchor portion.

8. The semiconductor device of claim 7, wherein said conductive body further has a contact portion formed on said surface of said isolating layer at another end of said extension portion opposite to said anchor portion.

9. The semiconductor device of claim 8, further comprising an insulative protecting layer formed on said isolating layer to cover said anchor and extension portions of said conductive body.

\* \* \* \* \*